(12) United States Patent
Willingham et al.

(10) Patent No.: US 7,064,598 B2
(45) Date of Patent: Jun. 20, 2006

(54) RADIO FREQUENCY CMOS BUFFER CIRCUIT AND METHOD

(75) Inventors: Scott D. Willingham, Austin, TX (US); Augusto M. Marques, Austin, TX (US)

(73) Assignee: Silicon Laboratories, Inc., Austin, TX (US)

(*) Notice: Subject to any disclaimer, the term of this patent is extended or adjusted under 35 U.S.C. 154(b) by 2 days.

(21) Appl. No.: 10/809,195

(22) Filed: Mar. 25, 2004

(65) Prior Publication Data
US 2005/0212581 A1    Sep. 29, 2005

(51) Int. Cl.
*H03L 5/00* (2006.01)
(52) U.S. Cl. .................. 327/333; 327/108; 327/391
(58) Field of Classification Search ........ 327/108–112, 327/333, 427, 170, 379, 389, 391; 326/63–71, 326/73, 74, 80–83, 26, 27; 330/262, 264, 330/265, 267, 270, 271, 273
See application file for complete search history.

(56) References Cited

U.S. PATENT DOCUMENTS 4,906,871 A * 3/1990 Iida .............................. 326/66
5,491,441 A * 2/1996 Goetschel et al. .......... 327/291
6,864,736 B1 * 3/2005 Guedon et al. ............. 327/333

OTHER PUBLICATIONS

Weste et al., Principles of CMOS VLSI Design: A Systems Perspective, 2nd Edition, Addison Wesley, 1993, p. 207-213.*

* cited by examiner

*Primary Examiner*—Long Nguyen
(74) *Attorney, Agent, or Firm*—Larson Newman Abel Polansky & White, LLP

(57) ABSTRACT

A buffer (40) includes a capacitor (42) having a first terminal for receiving an input signal, and a second terminal; a first transistor (44) having a first current electrode for receiving a first power supply voltage, a control electrode coupled to the second terminal of the capacitor (42), and a second current electrode for providing an output signal of the buffer (40); and a second transistor (45) having a first current electrode coupled to the second current electrode of the first transistor (44), a control electrode coupled to the second terminal of the capacitor (42), and a second current electrode for receiving a second power supply voltage. A capacitance of the capacitor (42) is chosen to reduce a peak-to-peak voltage swing of the input signal such that a peak-to-peak voltage swing at the control electrodes of the first (44) and second (45) transistors is less than or equal to a difference between the first and second power supply voltages.

20 Claims, 3 Drawing Sheets

RADIO FREQUENCY CMOS BUFFER CIRCUIT AND METHOD

FIELD OF THE DISCLOSURE

The invention relates generally to buffer circuits, and more particularly to buffer circuits capable of providing current gain at radio frequencies.

BACKGROUND

In many integrated circuits it is common to isolate a signal source from a load by buffering. One advantage of buffering is that it can be used to prevent a large load from interfering with the operation of the signal source. Thus a well-designed buffer will provide a much smaller load impedance to the signal source than the load being driven by the buffer.

In some circumstances the buffer is required not only to isolate the load but also to translate the signal output by the signal source from one voltage level to another. For example in modern complementary metal oxide semiconductor (CMOS) integrated circuit fabrication processes, it is common to have multiple gate oxide thicknesses to accommodate both high-voltage and low-voltage transistors. The thicker gate oxide of the high voltage transistors make them able to withstand higher gate voltages without causing harmful stress to their gate oxide. Thus they may be used in higher voltage circuits. For example, a digital input buffer may use high-voltage transistors to receive an external signal that varies between 0 and 3.0 volts.

Sometimes an external signal source or a circuit using high voltage transistors produces a time-varying (AC) signal with a relatively large peak-to-peak voltage. Since this signal must be subsequently processed in circuitry using low-voltage transistors, the buffer must also scale the peak-to-peak voltage so that it does not damage the low-voltage transistors. Some such circuits are known for radio frequency (RF) applications, and as used herein, a radio frequency signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc.

However modern CMOS processes have made more RF processing possible on-chip. At the same time, new buffers suitable for isolating loads from signal sources and translating signals from one voltage level to another are needed.

BRIEF SUMMARY

Thus in one form the present invention provides a buffer including a capacitor and first and second transistors. The capacitor has a first terminal for receiving an input signal, and a second terminal. The first transistor has a first current electrode coupled to a first power supply voltage terminal for receiving a first power supply voltage, a control electrode coupled to the second terminal of the capacitor, and a second current electrode for providing an output signal of the buffer. The second transistor has a first current electrode coupled to the second current electrode of the first transistor, a control electrode coupled to the second terminal of the capacitor, and a second current electrode coupled to a second power supply voltage terminal for receiving a second power supply voltage. The input signal has a peak-to-peak voltage swing equal to a first voltage. A voltage difference between the first power supply voltage and the second power supply voltage is equal to a second voltage that is lower than the first voltage. A capacitance of the capacitor is chosen such that a peak-to-peak voltage swing at the control electrodes of the first and second transistors is less than or equal to the second voltage.

In another form the present invention provides a circuit including a signal source and a buffer. The signal source has an output terminal for providing a time-varying signal having a peak-to-peak signal swing equal to a first voltage. The buffer is coupled to first and second power supply voltage terminals for respectively receiving first and second power supply voltages thereon, and has an input terminal coupled to the output terminal of the signal source, and an output terminal. A difference between the first and second power supply voltages is equal to a second voltage that is less than the first voltage. The buffer includes a capacitor and first and second transistors. The capacitor has a first terminal coupled to the output terminal of the signal source, and a second terminal. The first transistor has a first current electrode coupled to the first power supply voltage terminal, a control electrode coupled to the second terminal of the capacitor, and a second current electrode for providing an output signal of the buffer. The second transistor has a first current electrode coupled to the second current electrode of the first transistor, a control electrode coupled to the second terminal of the capacitor, and a second current electrode coupled to the second power supply voltage terminal. A capacitance of the capacitor is chosen such that a peak-to-peak voltage swing at the control electrodes of the first and second transistors is less than or equal to the second voltage.

In yet another form the present invention provides a method of buffering an input signal having a peak-to-peak voltage equal to a first voltage. The first voltage is capacitively divided using a capacitive divider formed by a capacitor having a first terminal for receiving the input signal and a second terminal in series with a parasitic capacitance formed by control electrodes of first and second transistors to provide a second signal at the second terminal of the capacitor having a peak-to-peak voltage equal to a second voltage. The second signal is buffered using a buffer that includes the first and second transistors and is driven by a power supply voltage that is less than the first voltage and greater than or equal to the second voltage.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DESCRIPTION OF THE PREFERRED EMBODIMENT(S)

Figure 1:
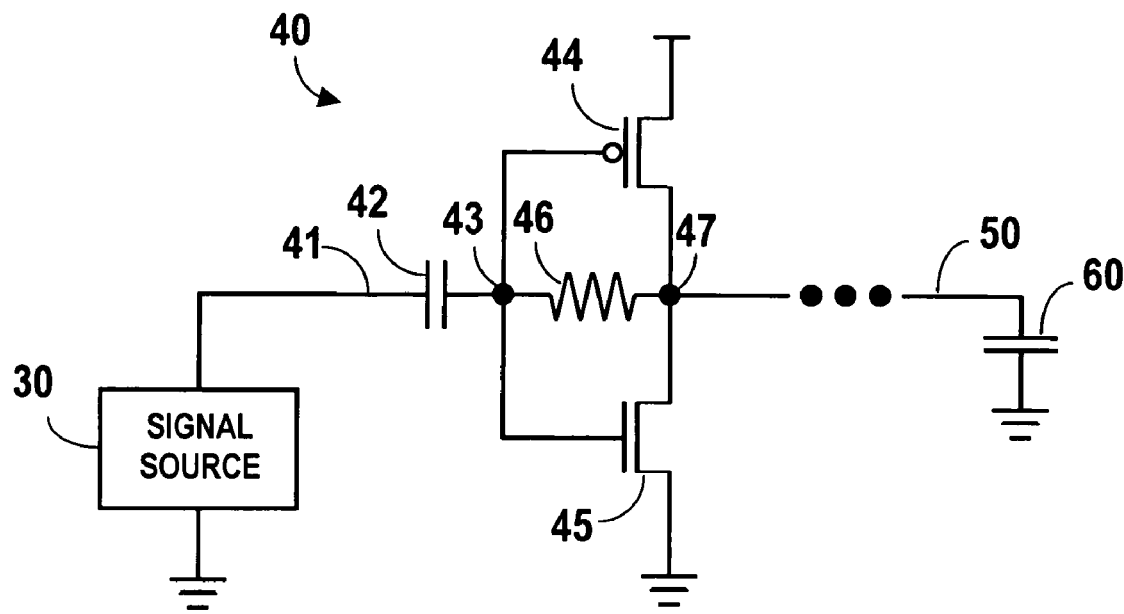
FIG. 1 illustrates in partial schematic and partial block diagram form a circuit using a buffer in accordance with the present invention.

FIG. 1 illustrates in partial schematic and partial block diagram form a circuit 20 using a buffer 40 in accordance with the present invention. Circuit 20 includes generally a signal source 30, buffer 40, an interconnect line 50, and a load 60. Signal source 30 provides a time-varying (AC) signal to an output terminal thereof referenced to a ground terminal. Signal source 30 may be any number of circuits including a voltage controlled oscillator (VCO), an external clock or oscillator, an output of a radio frequency (RF) amplifier, a modulator, etc. Buffer 40 includes generally a capacitor 42, a P-channel metal-oxide-semiconductor (MOS) transistor 44, an N-channel MOS transistor 45, and a resistor 46. Capacitor 42 has a first terminal connected to the output terminal of signal source 30 at a node 41, and a second terminal connected to a node 43. Transistor 44 has a source connected to a first power supply voltage terminal for receiving a first power supply voltage, a gate connected to the second terminal of capacitor 42 at node 43, and a drain connected to an output node 47. The first power supply voltage is a relatively low positive power supply voltage having a nominal value of about 1.2 volts. Transistor 45 has a drain connected to the drain of transistor 44 at node 47, a gate connected to the second terminal of capacitor 42 at node 43, and a source connected to a second power supply voltage terminal for receiving a second power supply voltage, designated ground, having a nominal voltage of about 0 volts. Resistor 46 has a first terminal connected to the second terminal of capacitor 42 at node 43, and a second terminal connected to the drains of transistors 44 and 45 at node 47. Interconnect line 50 has a first end connected to the drains of transistors 44 and 45 at node 47, and a second end. Load 60 is in the form of a capacitor having a first terminal connected to the second end of interconnect line 50, and a second terminal connected to ground.

Buffer 40 translates an AC input signal having a relatively high peak-to-peak voltage swing on provided by signal source 30 to node 41 into a second signal having a smaller peak-to-peak voltage swing at node 47. In the illustrated embodiment the voltage swing on the signal at node 41 is about 3.5 volts, and the power supply voltage for buffer 40 is about 1.2 volts. Buffer 40 uses capacitive voltage division between the capacitance of capacitor 42 and the parasitic gate capacitances of transistors 44 and 45 to reduce this signal swing to about 1.2 volts (the first power supply voltage) or less. In one embodiment, transistors 44 and 45 have a gate oxide thickness that is substantially a minimum thickness of an associated manufacturing process. Thus buffer 40 can use faster low-voltage transistors while reducing the loading seen by signal source 30 and hence power consumption.

The voltage swing at node 43 is equal to $$V_{43} \approx \frac{C_{42}}{C_{42} + C_{gs}} \cdot 3.5 \text{ V} \quad [1]$$

wherein $C_{42}$ is the capacitance of capacitor 42, and Cgs is the combined capacitance of the parasitic gate-to-source capacitors of transistors 44 and 45. By choosing $C_{42}$ to be a little larger than $C_{gs}$, the voltage swing at node 43 can be reduced to about 1.2 V, which is small enough to avoid stressing low voltage transistors 44 and 45. Buffer 40 implements capacitive voltage division using the parasitic gate-to-source capacitance of transistors 44 and 45. This voltage transformation also forms an impedance transformation that reduces the load seen by signal source 30. The electrical characteristics of buffer 40 will now be further explained with reference to FIGS. 2–5 below.

Figure 2:
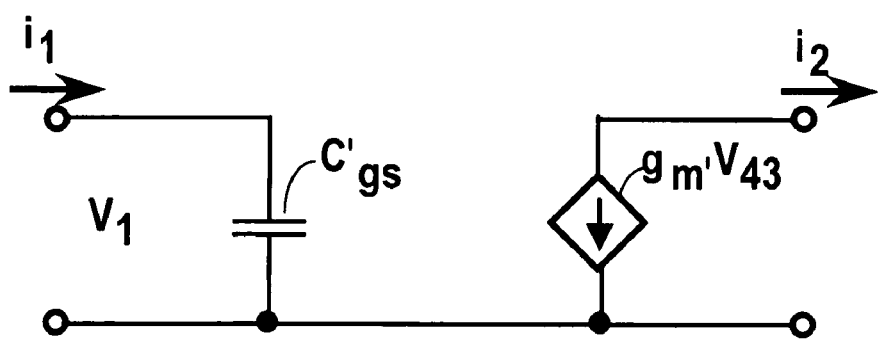
FIG. 2 illustrates in schematic form a small-signal mode of buffer 40 of FIG. 1 without considering AC coupling capacitor 42.

FIG. 2 illustrates in schematic form a small-signal model 80 of buffer 40 of FIG. 1 without considering AC coupling capacitor 42. The current gain can be expressed as:

$$\frac{i_2}{i_1} = \frac{-g_m}{2\pi f C_{gs}} \quad [2]$$

wherein $g_m$ is the transconductance of the combination of transistors 44 and 45.

Figure 3:
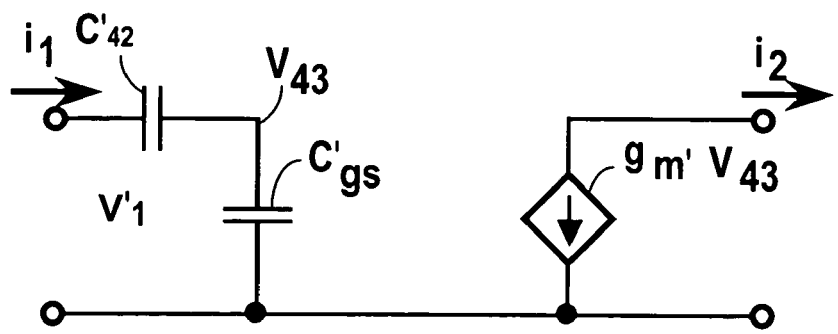
FIG. 3 illustrates schematic form a small-signal mode of buffer 40 of FIG. 1 that takes into account AC coupling capacitor 42.

FIG. 3 illustrates in schematic form a small-signal model 90 of buffer 40 that takes into account AC coupling capacitor 42. The current gain is identical to that of the circuit in FIG. 2. For the same load current, $i_2$, an identical $i_1$ is required. The corresponding input voltage, $V_1'$, however, must now satisfy:

$$V_1' = V_1 \cdot \left(\frac{C_{gs} + C_{42}}{C_{42}}\right) \quad [3]$$

Thus the addition of AC coupling capacitor 42 enhances the input impedance, $Z_1' = V_1'/i_1$ by a factor of $$\left(\frac{C_{gs} + C_{42}}{C_{42}}\right),$$

which in the present example is equal to about 2. Alternatively, the input capacitance of buffer 40 is $$\left(\frac{C_{gs} C_{42}}{C_{42} + C_{gs}}\right),$$

a factor of $$\left(\frac{C_{42}}{C_{42} + C_{gs}}\right)$$

smaller than the circuit modeled in FIG. 2. Buffer 40 takes advantage of the large available input voltage to reduce the source loading impedance. Incorporating the input capacitance of transistors 44 and 45 in buffer 40 yields a clean, efficient result.

Figure 4:
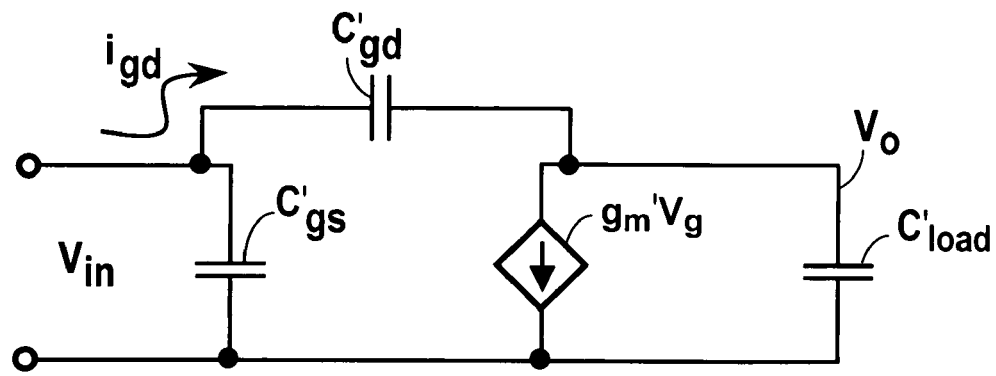
FIG. 4 illustrates in schematic form a small signal model of buffer 40 of FIG. 1 that takes into account the gate-drain overlap capacitance.

The input conductance of a capacitively loaded inverter has a real (i.e. a resistive) loss component due to gate-drain overlap capacitance. FIG. 4 illustrates in schematic form a small signal model 100 of buffer 40 of FIG. 1 taking into account the gate-drain overlap capacitance. Assuming the transfer function is only slightly perturbed by the gate-to-drain capacitance ($C_{gd}$), the gain G can be expressed as:

$$G(j\omega) = \frac{V_o}{V_{in}} \approx \frac{-g_m}{C_{load}j\omega} = j\frac{g_m}{C_{load}\omega} \quad [4]$$

wherein $C_{load}$ is the capacitance of load capacitor 60. The current in the gate-to-drain overlap capacitor can then be expressed as:

$$\frac{i_{gd}}{V_{in}} \approx (1-G)C_{gd} \cdot j\omega = \left(1 - j\frac{g_m}{C_{load}\omega}\right)C_{gd}j\omega = g_m \cdot \frac{C_{gd}}{C_{load}} + jC_{gd}\omega \quad [5]$$

The equivalent input conductance is $$G_{in} = \text{Re}\left\{\frac{i_{gd}}{V_{in}}\right\} = g_m \cdot \frac{C_{gd}}{C_{load}} \quad [6]$$

By design, $$\frac{g_m}{C_{load} \cdot \omega} \approx 1$$

at the frequency of interest, therefore $G_{in} \approx \omega C_{gd}$.

Note that this result resembles a capacitive conductance, but it is a real (i.e. resistive) loss. The phase relationship of $V_o$ versus $V_{in}$ results in a gate-to-drain current $i_{gd}$ that is in phase with $V_{in}$, and the inventors have confirmed this result in circuit simulations. Short-channel MOS transistors, being narrower for a given $g_m$, generally have a lower $C_{gd}$ and lower conductive losses. Thus buffer 40 also reduces these conductive losses.

Figure 5:
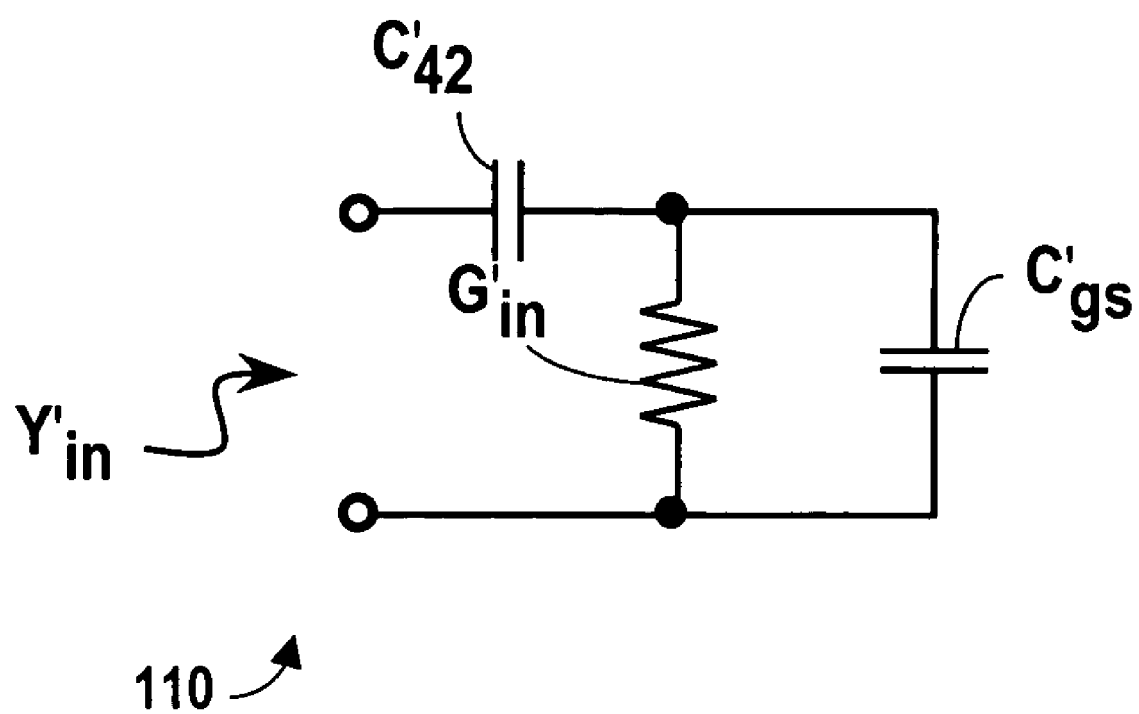
FIG. 5 illustrates in schematic form an input impedance model of the buffer of FIG. 1.

FIG. 5 illustrates in schematic form an input impedance model 110 of buffer 40 of FIG. 1. In model 110 the real equivalent conductance is modeled as a resistor with a resistance equal to $G_{in}$. If the complex input impedance is designated $Y'_{in}$, then $$Y'_{in} = \frac{C_{42} \cdot j\omega(G_{in} + C_{gs} \cdot j\omega)}{G_{in} + j\omega(C_{gs} + C_{42})} \quad [7]$$

and the real component $G'_{in}$ is:

$$G'_{in} = \text{Re}\{Y'in\} = \frac{G_{in}C_{42}^2\omega^2}{G_{in}^2 + (C_{gs} + C_{42})^2\omega^2} \quad [8]$$

At high frequencies:

$$G'_{in} \approx Gin \cdot \left(\frac{C_{42}}{C_{gs} + C_{42}}\right)^2 \quad [9]$$

For example, if $C_{42} \leq C_{gs}$, then $$G'_{in} \leq \frac{G_{in}}{4} \quad [10]$$

At very high frequencies, such as 8 gigahertz (GHz) in a 0.13 micron CMOS process, buffer 40 saves substantial power consumption and reduces critical loading on the signal source.

Thus buffer 40 provides low input impedance and low conductive losses. Buffer 40 uses the inherent parasitic capacitance of MOS transistors in conjunction with another capacitor to form a capacitive divider to reduce the voltage swing of an AC signal presented to the MOS transistors. This voltage swing reduction allows the use of fast, low-voltage transistors having relatively-thin gate oxide without stressing the gate oxide. If the peak-to-pesk voltage swing on the input signal is equal to a first voltage then, in one embodiment, these low-voltage transistors can have an oxide stress voltage that is less than the first voltage.

What is claimed is:

1. A buffer comprising:
   a capacitor having a first terminal for receiving an input signal, and a second terminal;
   a first transistor having a first current electrode coupled to a first power supply voltage terminal for receiving a first power supply voltage, a control electrode coupled to said second terminal of said capacitor, and a second current electrode for providing an output signal of the buffer;
   a second transistor having a first current electrode coupled to said second current electrode of said first transistor, a control electrode coupled to said second terminal of said capacitor, and a second current electrode coupled to a second power supply voltage terminal for receiving a second power supply voltage;
   wherein said input signal has a peak-to-peak voltage swing equal to a first voltage;
   wherein a voltage difference between said first power supply voltage and said second power supply voltage is equal to a second voltage that is lower than said first voltage; and
   wherein a capacitance of said capacitor is chosen such that a peak-to-peak voltage swing at said control electrodes of said first and second transistors is less than or equal to said second voltage, and wherein the capacitance of said capacitor is greater than a combined parasitic capacitance of the first transistor and the second transistor.

2. The buffer of claim 1, further comprising;
   a resistor having a first terminal coupled to said second terminal of said capacitor, and a second terminal coupled to said second current electrode of said first transistor.

3. The buffer of claim 1, wherein said first and second transistors comprise metal oxide semiconductor (MOS) field effect transistors.

4. The buffer of claim 3, wherein said first transistor comprises a P-channel MOS field effect transistor and said second transistor comprises an N-channel MOS field effect transistor.

5. The buffer of claim 1, wherein said first and second transistors are characterized as having an oxide stress voltage less than said first voltage.

6. The buffer of claim 5, wherein said first and second transistors are characterized as having a gate oxide thickness that is substantially a minimum thickness of an associated manufacturing process.

7. The buffer of claim 1, wherein said first voltage is about 3.5 volts, and said second voltage is about 1.2 volts.

8. A circuit comprising:
   a signal source having an output terminal for providing a time-varying signal having a peak-to-peak signal swing equal to a first voltage; and
   a buffer coupled to first and second power supply voltage terminals for respectively receiving first and second power supply voltages thereon, and having an input terminal coupled to said output terminal of said signal source, and an output terminal;
   a difference between said first and second power supply voltages being equal to a second voltage that is less than said first voltage;
   wherein said buffer comprises:
   a capacitor having a first terminal coupled to said output terminal of said signal source, and a second terminal;
   a first transistor having a first current electrode coupled to said first power supply voltage terminal, a control electrode coupled to said second terminal of said capacitor, and a second current electrode far providing an output signal of said buffer;
   a second transistor having a first current electrode coupled to said second current electrode of said first transistor, a control electrode coupled to said second terminal of said capacitor, and a second current electrode coupled to said second power supply voltage terminal;
   wherein a capacitance of said capacitor is chosen such that a peak-to-peak voltage swing at said control electrodes of said first and second transistors is less than or equal to said second voltage, and wherein the capacitance of the capacitor is greater than a combined parasitic capacitance of the first transistor and the second transistor.

9. The circuit of claim 8, further comprising:
   an interconnect line having a first end coupled to said output terminal of said buffer, and a second end; and
   a load coupled to said second end of said interconnect line.

10. The circuit of claim 9, wherein said load comprises:
    a capacitor having a first terminal coupled to said second end of said interconnect line, and a second terminal coupled to said second power supply voltage terminal.

11. The circuit of claim 8, wherein said buffer further comprises:
    a resistor having a first terminal coupled to said second terminal of said capacitor, and a second terminal coupled to said second current electrode of said first transistor.

12. The circuit of claim 8, wherein said first and second transistors comprise metal oxide semiconductor (MOS) field effect transistors.

13. The circuit of claim 12, wherein said first transistor comprises a P-channel MOS field effect transistor and said second transistor comprises an N-channel MOS field effect transistor.

14. The circuit of claim 11, wherein said first and second transistors are characterized as having an oxide stress voltage less than said first voltage.

15. The circuit of claim 14, wherein said first and second transistors are characterized as having a gate oxide thickness that is substantially a minimum thickness of an associated manufacturing process.

16. The circuit of claim 8, wherein said first voltage is about 3.5 volts, and said second voltage is about 1.2 volts.

17. A method of buffering an input signal having a peak-to-peak voltage
    equal to a first voltage comprising the steps of:
    capacitively dividing the first voltage using a capacitive divider formed by a capacitor having a first terminal for receiving the input signal and a second terminal in series with a parasitic capacitance formed by control electrodes of first and second transistors to provide a second signal at said second terminal of said capacitor having a peak-to-peat voltage equal to a second voltage, wherein a capacitance of said capacitor is mater than the parasitic capacitance; and
    buffering said second signal using a buffer including said first and second transistors driven by a power supply voltage that is less than said first voltage and greater than or equal to said second voltage.

18. The method of claim 17, wherein said step of buffering comprises the step of: buffering said second signal using said buffer in which said first transistor has a first current electrode coupled to said power supply voltage, a control electrode coupled to said second terminal of said capacitor, and a second current electrode coupled to a first current electrode of said second transistor which also has a control electrode coupled to said second terminal of said capacitor, and a second current electrode coupled to a second power supply voltage terminal.

19. The method of claim 17, further comprising the step of:
    using an output of said buffer to drive a load coupled to said buffer through an interconnect line.

20. The method of claim 17, further comprising the step of:
    biasing an input terminal of said buffer using a resistor coupled between an output terminal and said input terminal of said buffer.

* * * * *